(12) United States Patent
Oh et al.

(10) Patent No.: US 9,711,575 B2
(45) Date of Patent: Jul. 18, 2017

(54) ORGANIC LIGHT EMITTING DISPLAY DEVICE AND METHOD OF MANUFACTURING AN ORGANIC LIGHT EMITTING DISPLAY DEVICE

(71) Applicant: Samsung Display Co., Ltd., Yongin-si (KR)

(72) Inventors: Eon-Seok Oh, Seoul (KR); Na-Jeong Kim, Yongin-si (KR); Sang-Yeol Kim, Hwaseong-si (KR); Jung-Yeon Kim, Suwon-si (KR); Min-Kyung Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/354,855

(22) Filed: Nov. 17, 2016

(65) Prior Publication Data

US 2017/0069698 A1    Mar. 9, 2017

Related U.S. Application Data

(63) Continuation of application No. 14/797,616, filed on Jul. 13, 2015, now Pat. No. 9,530,980.

(30) Foreign Application Priority Data

Feb. 13, 2015  (KR) .......................... 10-2015-0022370

(51) Int. Cl.
*H01L 27/32* (2006.01)
*H01L 51/00* (2006.01)
(Continued)

(52) U.S. Cl.
CPC ........ *H01L 27/3246* (2013.01); *H01L 27/326* (2013.01); *H01L 51/0048* (2013.01);
(Continued)

(58) Field of Classification Search
CPC ............ H01L 51/5212; H01L 51/5234; H01L 51/0048; H01L 51/5228; H01L 51/56
See application file for complete search history.

(56) References Cited

U.S. PATENT DOCUMENTS

2014/0110681 A1    4/2014  Hack et al.
2014/0183479 A1*   7/2014  Park ........................ H01L 51/56
                                                       257/40

FOREIGN PATENT DOCUMENTS

KR    10-2014-0017420    2/2014
KR    10-2014-0063174    5/2014
(Continued)

OTHER PUBLICATIONS

Notice of Allowance dated Aug. 22, 2016 in U.S. Appl. No. 14/797,616.

*Primary Examiner* — Kyoung Lee
(74) *Attorney, Agent, or Firm* — H.C. Park & Associates, PLC

(57) ABSTRACT

An organic light emitting display device may include a substrate, an anode, an auxiliary electrode, a light emitting structure, a lower cathode, and an upper cathode. The substrate may include a pixel region, a transparent region, and a boundary region between the pixel region and the transparent region. The anode may be on the pixel region. The auxiliary electrode may be on the transparent or boundary regions. The light emitting structure may be on the anode and the auxiliary electrode and extended from the pixel region to the transparent region. The lower cathode may be on the light emitting structure and made thin to increase transmittance. The upper cathode may be on the lower cathode. The thin lower cathode may be electrically connected to the auxiliary electrode via a contact hole which penetrates the light emitting structure so as to reduce a voltage drop.

15 Claims, 12 Drawing Sheets

(51) Int. Cl.
    *H01L 51/52*         (2006.01)
    *H01L 51/56*         (2006.01)

(52) U.S. Cl.
    CPC ...... *H01L 51/5228* (2013.01); *H01L 51/5234* (2013.01); *H01L 51/56* (2013.01)

(56) References Cited

FOREIGN PATENT DOCUMENTS

| | | |
|---|---|---|
| KR | 10-2014-0085979 | 7/2014 |
| KR | 10-2016-0059501 | 5/2016 |

\* cited by examiner

ORGANIC LIGHT EMITTING DISPLAY DEVICE AND METHOD OF MANUFACTURING AN ORGANIC LIGHT EMITTING DISPLAY DEVICE

CROSS-REFERENCE TO RELATED APPLICATION

This application is a continuation of U.S. patent application Ser. No. 14/797,616, filed on Jul. 13, 2015, and claims priority from and the benefit of Korean Patent Application No. 10-2015-0022370, filed on Feb. 13, 2015, each of which is hereby incorporated by reference for all purposes as if fully set forth herein.

BACKGROUND

Field

Exemplary embodiments relate to organic light emitting display devices and methods of manufacturing the organic light emitting display devices. More particularly, exemplary embodiments relate to organic light emitting display devices including a plurality of pixel regions and transparent regions, and methods of manufacturing the organic light emitting display devices.

Discussion of the Background

Recently, interest in transparent organic light emitting display (OLED) devices has increased. In general, the transparent OLED device may include a pixel region to emit light and a transparent region to transmit external light.

Methods for improving transmittance of the transparent region have been researched. A thin cathode for an organic light emitting element has been tried to improve the transmittance of the transparent region. However, quality and/or reliability of the transparent OLED device may be decreased by high resistance of the thin cathode.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display (OLED) device with an improved transmittance.

Exemplary embodiments further provide a method of manufacturing the OLED device.

Additional aspects will be set forth in the detailed description which follows, and, in part, will be apparent from the disclosure, or may be learned by practice of the inventive concept An exemplary embodiment discloses an OLED device including a substrate, an anode, an auxiliary electrode, a light emitting structure, a lower cathode, and an upper cathode. The substrate may include a pixel region, a transparent region, and a boundary region between the pixel region and the transparent region. The anode may be on the pixel region. The auxiliary electrode may be on the transparent region or the boundary region. The light emitting structure may be on the anode and the auxiliary electrode. The light emitting structure may be extended from the pixel region to the transparent region. The lower cathode may be on the light emitting structure. The upper cathode may be on the lower cathode. The lower cathode may be electrically connected to the auxiliary electrode via a contact hole which penetrates the light emitting structure.

An exemplary embodiment also discloses a method of manufacturing an organic light emitting display (OLED) device. In the method, a substrate is provided to include a pixel region, a transparent region, and a boundary region between the pixel region and the transparent region. An anode may be formed on the pixel region. An auxiliary electrode may be formed on the transparent region or the boundary region. A light emitting structure may be formed on the anode and the auxiliary electrode. The light emitting structure may be extended from the pixel region to the transparent region. A contact hole which penetrates the light emitting structure may be formed to expose the auxiliary electrode. A lower cathode may be formed on the light emitting structure. The lower cathode may be electrically connected to the auxiliary electrode via the contact hole. An upper cathode may be formed on the lower cathode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
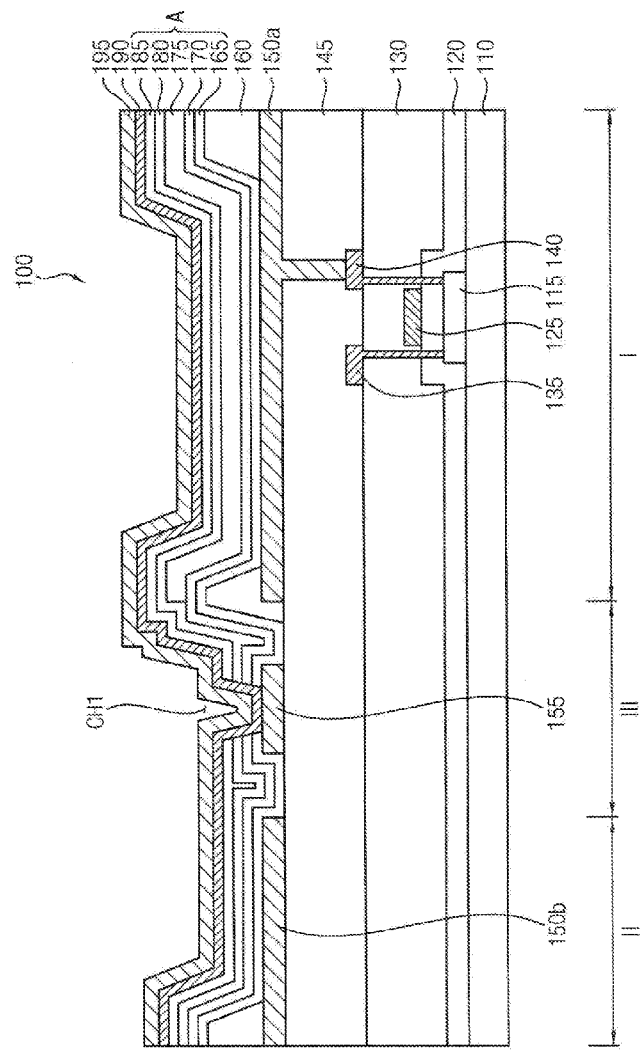
FIG. 1 is a cross-sectional view illustrating an organic light emitting display (OLED) device in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating an organic light emitting display (OLED) device in accordance with an exemplary embodiment.

Referring to FIG. 1, the OLED device 100 may include a substrate 110, at least one semiconductor element, anodes 150a and 150b, an auxiliary electrode 155, a pixel defining layer 160, a light emitting structure A, a contact hole CH1, a lower cathode 190, and an upper cathode 195.

The substrate 110 may include a pixel region I, a transparent region II, and a boundary region III between the pixel region I and the transparent region II. For example, the substrate 110 may include a transparent insulation substrate such as a glass substrate, a quartz substrate, a resin substrate, or the like. In some exemplary embodiments, the substrate 110 may include a flexible substrate.

At least one semiconductor element may be disposed on the pixel region I of the substrate 110. The semiconductor element may include an active pattern 115, a gate insulation layer 120, a gate electrode 125, an insulating interlayer 130, a source electrode 135, and a drain electrode 140. The semiconductor element illustrated in FIG. 1 may have a top-gate structure in which the gate electrode 125 is disposed over the active pattern 115. However, the semiconductor element may have a bottom-gate structure in which the gate electrode 125 is disposed under the active pattern 115.

The active pattern 115 may be disposed on the substrate 110. For example, the active pattern 115 may include a material having a silicon, an oxide semiconductor, or the like. The active pattern 115 is directly disposed on the substrate 110 in FIG. 1. However, in some exemplary embodiments, a buffer layer (not illustrated) may be further disposed between the substrate 110 and the active pattern 115. The buffer layer may prevent impurities (i.e., water or gas) from being diffused into the substrate 110 and/or the active pattern 115. The buffer layer may include a silicon compound, such as silicon oxide, silicon nitride, silicon oxynitride, or the like.

The gate insulation layer 120 may be disposed on the substrate 110 to cover the active pattern 115. The gate insulation layer 120 may be extended from the pixel region I to the transparent region II. The gate insulation layer 120 may insulate the gate electrode 125 from the active pattern 115. For example, the gate insulation layer 120 may include a silicon compound having insulation and transparent characteristics such as silicon oxide, silicon nitride, silicon oxynitride, or the like.

The gate electrode 125 may be disposed on the gate insulation layer 120 to partially overlap the active pattern

115. For example, the gate electrode 125 may include metal, alloy, metallic nitride, a transparent conductive material, or the like.

The insulating interlayer 130 may be disposed on the gate insulation layer 120 to cover the gate electrode 125. The insulating interlayer 130 may be extended from the pixel region I to the transparent region II. The insulating interlayer 130 may insulate the source and drain electrodes 135 and 140 from the gate electrode 125. For example, the insulating interlayer 130 may include a silicon compound such as silicon oxide, silicon nitride, silicon oxynitride, or the like. When the insulating interlayer 130 includes a silicon compound, the characteristics of the insulating interlayer 130 may be substantially the same as the characteristics of the buffer layer and the gate insulation layer 120 such that external light may not be refracted or reflected. Thus, transmittance of the transparent region II may not decrease. Further, the transmittance of the transparent region II may not decrease due to a material property (i.e., transparency) of the insulating interlayer 130.

The source and drain electrodes 135 and 140 may penetrate the gate insulation layer 120 and the insulating interlayer 130 to contact the active pattern 115. For example, the source and drain electrodes 135 and 140 may include metal, alloy, metallic nitride, conductive metallic oxide, a transparent conductive material, or the like.

A planarization layer 145 may be disposed on the insulating interlayer 130 to cover the semiconductor element. The planarization layer 145 may be extended from the pixel region I to the transparent region II. For example, the planarization layer 145 may include a transparent organic material, such as acrylic resins, polyimide resins, epoxy-based resins, or polyester resins. Although the planarization layer 145 is disposed on the transparent region II, the amount of light that passes through the transparent region II may not decrease, because the planarization layer 145 includes a transparent organic material.

A first anode 150a and a second anode 150b may be disposed on the planarization layer 145. The first anode 150a may be disposed on the pixel region I, and the second anode 150b may be disposed on the transparent region II. In some exemplary embodiments, the second anode 150b may be omitted. In this case, the transmittance of the transparent region II may be improved.

As illustrated in FIG. 1, the first anode 150a may be electrically connected to the drain electrode 140. The first and second anodes 150a and 150b may include a transparent material. For example, the transparent material may include indium tin oxide (ITO), indium zinc oxide (IZO), zinc oxide ($ZnO_x$), tin oxide ($SnO_x$), gallium oxide ($GaO_x$), indium oxide ($InO_x$), or the like. In an exemplary embodiment, the OLED device 100 may be a top emission device in which emitted light exits through the lower and upper cathodes 190 and 195 to form images.

The auxiliary electrode 155 may be disposed on the boundary region III between the pixel region I and the transparent region II. In exemplary embodiments, the auxiliary electrode 155 may be on substantially the same plane as the first and second anodes 150a and 150b. For example, the first and second anodes 150a and 150b, and the auxiliary electrode 155 may be on the planarization layer 145. In exemplary embodiments, the auxiliary electrode 155 may include substantially the same material as the first and second anodes 150a and 150b. Each pixel may include one auxiliary electrode 155. In some exemplary embodiments, each sub-pixel may include one auxiliary electrode 155. The auxiliary electrode 155 may contact the lower cathode 190 via the contact hole CH1. Therefore, a voltage drop at the lower cathode 190 may be decreased or substantially removed.

The pixel defining layer 160 may be disposed on the first anode 150a and the planarization layer 145 to define the pixel region I. The pixel defining layer 160 may include a pixel opening that defines the pixel region I. In exemplary embodiments, the pixel defining layer 160 may further include a transparent opening that defines the transparent region II. Here, the pixel defining layer 160 is only disposed on the pixel region I such that the transmittance of the transparent region II may be improved. As illustrated in FIG. 1, the light emitting structure A may be disposed along a bottom and side walls of the pixel opening, and the lower and upper cathodes 190 and 195 may be disposed along a bottom and side walls of the transparent opening. For example, the pixel defining layer 160 may include organic or inorganic materials.

The light emitting structure A may be disposed on a portion of the first anode 150a and a portion of the pixel defining layer 160. The light emitting structure A may include a hole injection layer (HIL) 165, a hole transport layer (HTL) 170, an organic light emitting layer (EL) 175, an electron transport layer (ETL) 180, and an electron injection layer (EIL) 185. In exemplary embodiments, the light emitting structure A, with the exception of the EL 175, may be extended from the pixel region I to the transparent region II. In FIG. 1, the EL 175 includes a low molecular weight organic, so that the HIL 165 and the HTL 170 are disposed under the EL 175, and the ETL 180 and the EIL 185 are disposed on the EL 175. However, the composition of the light emitting structure A may not be limited thereto, and various layers may be further included. When the EL 175 includes a high molecular weight organic, the HIL 165 may be excluded from the light emitting structure A.

The lower cathode 190 may be disposed on the light emitting structure A. In exemplary embodiments, the lower cathode 190 may be extended from the pixel region I to the transparent region II. As described above, since the OLED device 100 may be a top emission device, the lower cathode 190 may include a transparent material. For example, the transparent material may include gold (Au), Aluminum (Al), silver (Ag), magnesium-silver alloy (MgAg), silver-magnesium alloy (AgMg), or the like. The thickness of the lower cathode 190 may be relatively thin to improve the transmittance of the lower cathode 190. However, the resistance of the lower cathode 190 may increase as the thickness of the lower cathode 190 decreases, so that the voltage drop at the lower cathode 190 may increase. Accordingly, the auxiliary electrode 155 may be contacted to the lower cathode 190 to improve the transmittance of the OLED device 100 and reduce the resistance of the lower cathode 190. The auxiliary electrode 155 may be electrically connected to the lower cathode 190 via the contact hole CH1 that penetrates the light emitting structure A. Thus, the resistance of the lower cathode 190 may be minimized due to the auxiliary electrode 155, so that the voltage drop due to the relatively thin thickness of the lower cathode 190 may be decreased. In other words, the lower cathode 190 is electrically connected to the auxiliary electrode 155 such that the resistance of the thin lower cathode 190 may be decreased. Therefore, the voltage drop by the thin lower cathode 190 may be substantially prevented.

In exemplary embodiments, the lower cathode 190 may be electrically connected to the second anode 150b through the auxiliary electrode 155. Thus, the resistance of the lower cathode 190 may be further reduced. In some exemplary embodiments, the lower cathode 190 may not be electrically connected to the second anode 150b.

The thickness of the lower cathode 190 may be less than about 50 Å. The transmittance of the pixel and transparent regions I and II may be efficiently increased when the thickness of the lower cathode 190 is less than about 50 Å. For example, the transmittance of the pixel and transparent regions I and II may be greater than about 80%.

The upper cathode 195 may be disposed on the lower cathode 190 and extended from the pixel region I to the transparent region II. In exemplary embodiments, the thickness of the upper cathode 195 may be greater than the thickness of the lower cathode 190. The upper cathode 195 may include a transparent material. For example, the transparent material may include titanium oxide ($TiO_x$), ITO, IZO, $ZnO_x$, magnesium oxide ($MgO_x$), poly(3,4-ethylenedioxyehiophene) polystyrene sulfonate (PEDOT:PSS), graphene, and a carbon nanotube (CNT) or the like. Accordingly, the transmittance of the OLED device 100 may not be decreased although the upper cathode 195 is disposed on the transparent region II. Further, degradation of reliability of the pixel region may be prevented, and the transmittance of the transparent region II may be ensured despite the relatively thin thickness of the lower cathode 190.

In exemplary embodiments, the transmittance of the upper cathode 195 may be greater than the transmittance of the lower cathode 190, when the thickness of the upper and lower cathodes 195 and 190 are substantially the same. Therefore, degradation of the transmittance may be relatively small when the thickness of the upper cathode 195 is greater than the thickness of the lower cathode 190.

In a typical transparent OLED device, the transmittance of a transparent region may be dependent on a structure of the transparent region. Since electrodes (e.g., anode and cathode) and organic layers (e.g., HIL, HTL, EL, ETL, and EIL) are disposed on the transparent region, the transmittance of the transparent region may decrease. A cathode having a relatively small thickness is suggested to improve the transmittance of the transparent region, although the resistance of the cathode may be increased. Thus, a voltage drop at the cathode may be increased, so that a quality and/or a reliability of the transparent OLED device may be decreased. In contrast, when a relatively thick cathode is formed to improve the quality and/or the reliability of the transparent OLED device, the voltage drop at the cathode may decrease. However, the transmittance of the transparent region may be decreased, and the thickness and weight of the transparent OLED device may be increased.

The OLED device 100 according to exemplary embodiments may include the lower cathode 190 and the upper cathode 195. The lower cathode 190 may be disposed on the light emitting structure A, and the thickness of the lower cathode 190 may be relatively thin. The upper cathode 195 may be disposed on the lower cathode 190, and the thickness of the upper cathode 195 may be relatively thick. Here, the lower cathode 190 is contacted to the auxiliary electrode 155 via the contact hole CH1 that penetrates the light emitting structure A, so that the voltage drop at the lower cathode 190 may be decreased. The upper cathode 195 may include a transparent material such that a high transmittance of the transparent region II may be ensured.

Figure 2:
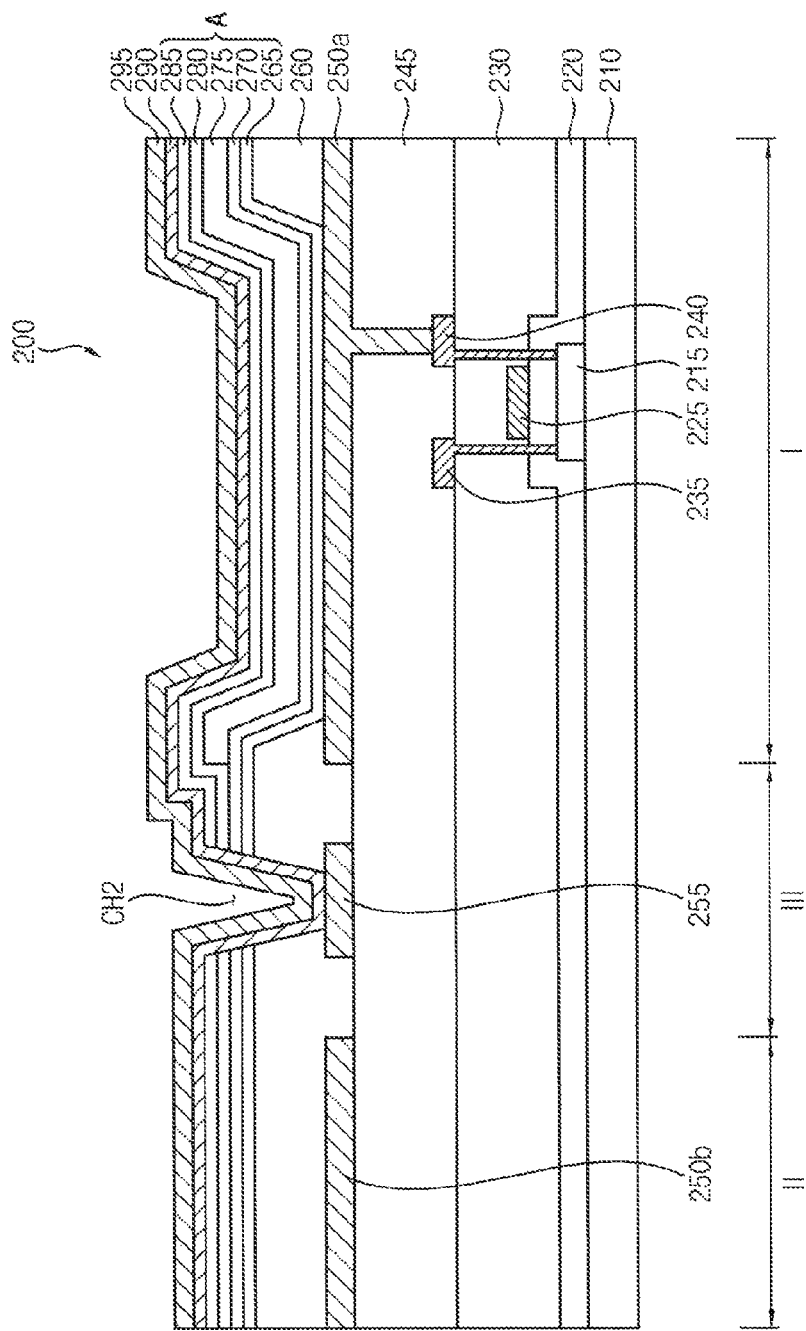
FIG. 2 is a cross-sectional view illustrating an OLED device in accordance with an exemplary embodiment.

FIG. 2 is a cross-sectional view illustrating an OLED device in accordance with some exemplary embodiments.

Detailed description on elements of the OLED device 200 which is substantially the same as, or similar to, those illustrated with reference to FIG. 1 are omitted.

Referring to FIG. 2, the OLED device 200 may include a substrate 210, at least one semiconductor element, anodes 250a and 250b, an auxiliary electrode 255, a pixel defining layer 260, a light emitting structure A, a contact hole CH2, a lower cathode 290, and an upper cathode 295.

The pixel defining layer 260 may be disposed on the anode on the pixel region I (i.e., a first anode 250a), the auxiliary electrode 255, and the anode on the transparent region II (i.e., a second anode 250b). The pixel defining layer 260 may include a pixel opening that defines the pixel region I. The pixel defining layer 260 may be extended to the transparent region II. For example, the pixel defining layer 260 may include transparent organic or inorganic materials. Although the pixel defining layer 260 is disposed on the transparent region II, the pixel defining layer 260 may include the transparent material such that the transmittance of the transparent region II may not decrease.

In exemplary embodiments, the lower cathode 290 may be electrically connected to the auxiliary electrode 255 via contact hole CH2 that penetrates the light emitting structure A and the pixel defining layer 260 on the boundary region III.

As described above, an additional process forming a transparent opening on the pixel defining layer 260 may not be required, so that the pixel defining layer 260 may be more easily manufactured. Also, the transmittance of the transparent region II may be ensured by the transparent material included in the pixel defining layer 260.

Figure 3:
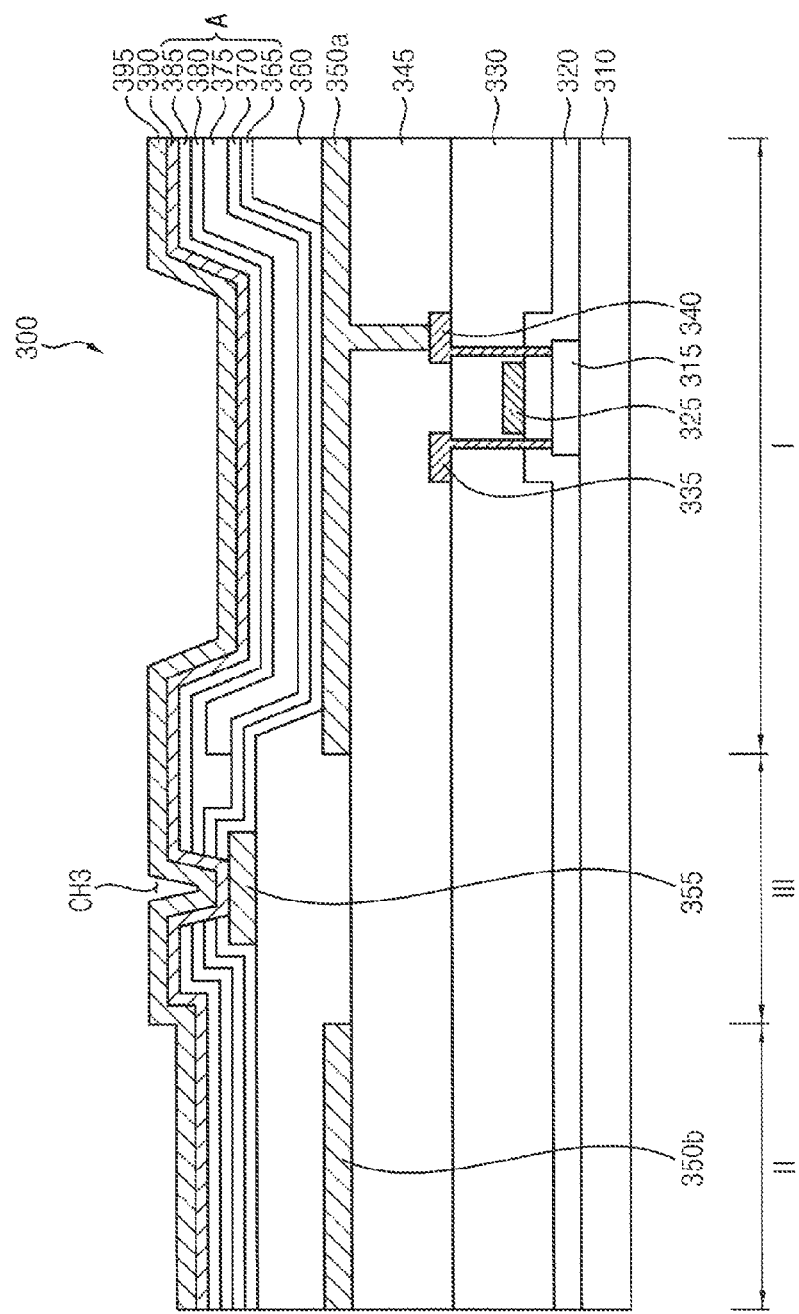
FIG. 3 is a cross-sectional view illustrating an OLED device in accordance with an exemplary embodiment.

FIG. 3 is a cross-sectional view illustrating an OLED device in accordance with some exemplary embodiments.

Detailed descriptions of elements of the OLED device 300 which are substantially the same as or similar to those illustrated with reference to FIG. 1 are omitted.

Referring to FIG. 3, the OLED device 300 may include a substrate 310, at least one semiconductor element, anodes 350a and 350b, an auxiliary electrode 355, a pixel defining layer 360, a light emitting structure A, a contact hole CH3, a lower cathode 390, and an upper cathode 395.

The auxiliary electrode 355 may be disposed on a different plane from first and second anodes 350a and 350b. For example, the auxiliary electrode 355 may be disposed on the pixel defining layer 360 of the boundary region III, the first anode 350a may be disposed on the planarization layer 345 of the pixel region I, and the second anode 350b may be disposed on the planarization layer 345 of the transparent region II.

The pixel defining layer 360 may include a pixel opening that defines the pixel region I and be extended along the transparent region II. For example, the pixel defining layer 360 may include transparent organic or inorganic materials. As the pixel defining layer 360 is disposed on the transparent region II, an additional process that forms a transparent opening on the pixel defining layer 360 may not be needed. Therefore, the pixel defining layer 360 may be formed with the improved process efficiency and process yield.

In exemplary embodiments, the lower cathode 390 may be electrically connected to the auxiliary electrode 355 via the contact hole CH3 that penetrates the light emitting structure A on the boundary region III.

Figure 4:
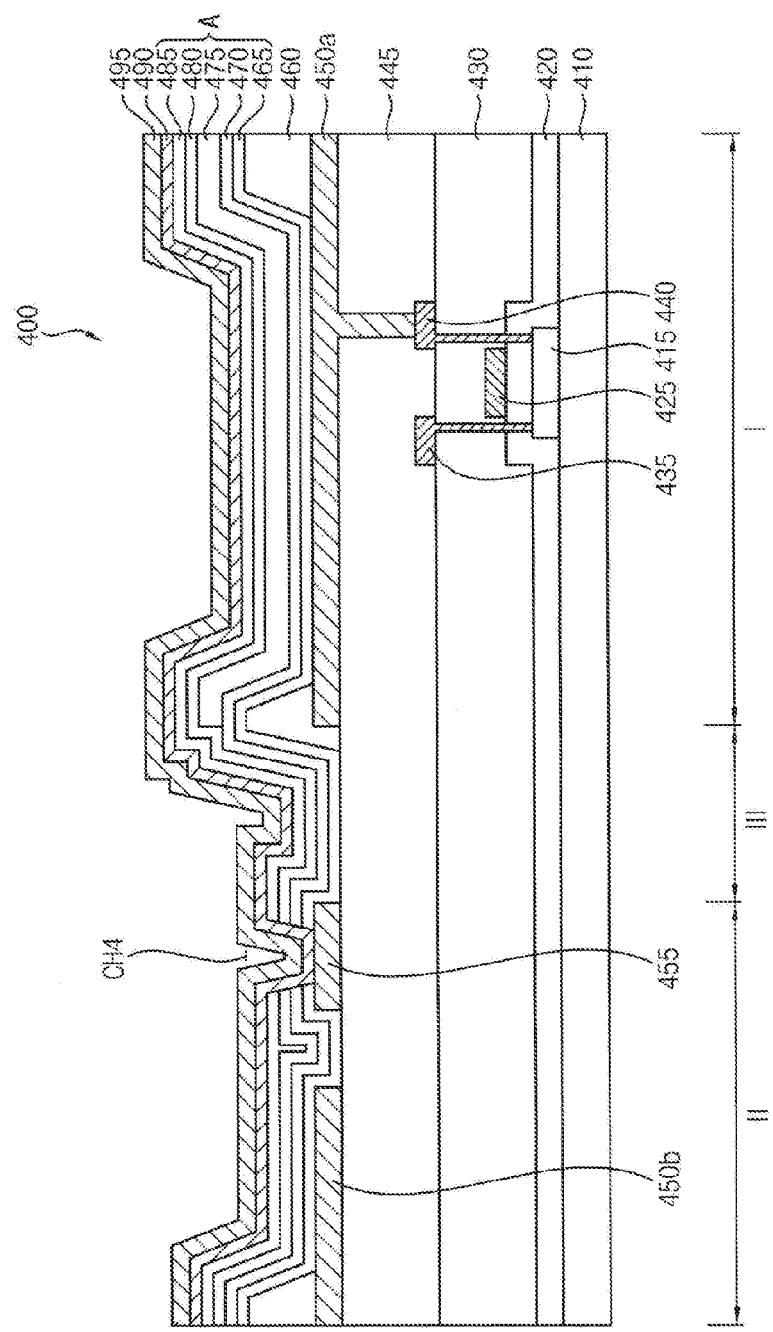
FIG. 4 is a cross-sectional view illustrating an OLED device in accordance with an exemplary embodiment.

FIG. 4 is a cross-sectional view illustrating an OLED device in accordance with some exemplary embodiments.

Detailed descriptions of elements of the OLED device 400 which are substantially the same as or similar to those illustrated with reference to FIG. 1 are omitted.

Referring to FIG. 4, the OLED device 400 may include a substrate 410, at least one semiconductor element, anodes 450a and 450b, an auxiliary electrode 455, a pixel defining layer 460, a light emitting structure A, a contact hole CH4, a lower cathode 490, and an upper cathode 495.

The auxiliary electrode 455 may be disposed on a planarization layer 445 of the transparent region II. The auxiliary electrode 455 may include substantially the same material as the first and second anodes 450a and 450b. For example, the auxiliary electrode 455 may include a transparent material such as ITO, IZO, $ZnO_x$, $SnO_x$, $GaO_x$, $InO_x$, or the like. In some exemplary embodiments, the auxiliary electrode 455 may include a transparent material that is different from materials included in the first and second anodes 450a and 450b. Therefore, although the auxiliary electrode 455 is disposed on the transparent region II, the transmittance of the transparent region II may not decrease.

The pixel defining layer 460 may include a pixel opening that defines the pixel region I and a transparent opening that defines the transparent region II. As the pixel defining layer 460 is not disposed on the transparent region II, the range of the materials for the pixel defining layer 460 may be widened, and the transmittance of the transparent region II may be considerably improved.

In exemplary embodiments, the lower cathode 490 may be electrically connected to the auxiliary electrode 455 via the contact hole CH4 that penetrates the light emitting structure A on the transparent region II.

Figure 5:
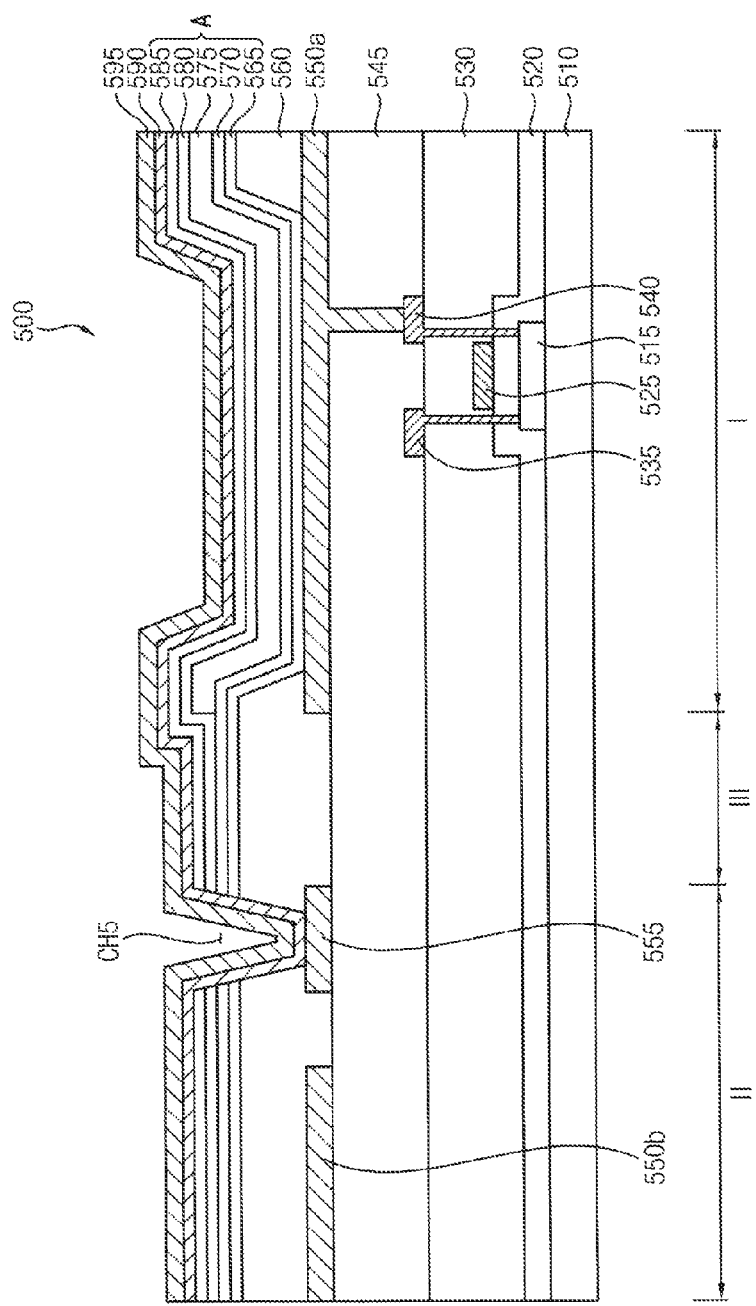
FIG. 5 is a cross-sectional view illustrating an OLED device in accordance with an exemplary embodiment.

FIG. 5 is a cross-sectional view illustrating an OLED device in accordance with some exemplary embodiments.

Detailed descriptions of elements of the OLED device 500 which are substantially the same as or similar to those illustrated with reference to FIG. 1 are omitted.

Referring to FIG. 5, the OLED device 500 may include a substrate 510, at least one semiconductor element, anodes 550a and 550b, an auxiliary electrode 555, a pixel defining layer 560, a light emitting structure A, a contact hole CH5, a lower cathode 590, and an upper cathode 595.

The auxiliary electrode 555 may be disposed on the planarization layer 545 of the transparent region II. The auxiliary electrode 555 may include a transparent material, so that the auxiliary electrode 555 on the transparent region II may not substantially decrease the transmittance of the transparent region II.

The pixel defining layer 560 may be extended to the transparent region II. The pixel defining layer 560 on the transparent region II may include transparent organic or inorganic materials, so that the transmittance of the transparent region II may be substantially maintained, and the pixel defining layer 560 may be provided with a reduced manufacturing time and a reduced manufacturing cost.

In exemplary embodiments, the lower cathode 590 may be electrically connected to the auxiliary electrode 555 via the contact hole CH5 that penetrates the light emitting structure A and the pixel defining layer 560 on the transparent region II.

Figure 6:
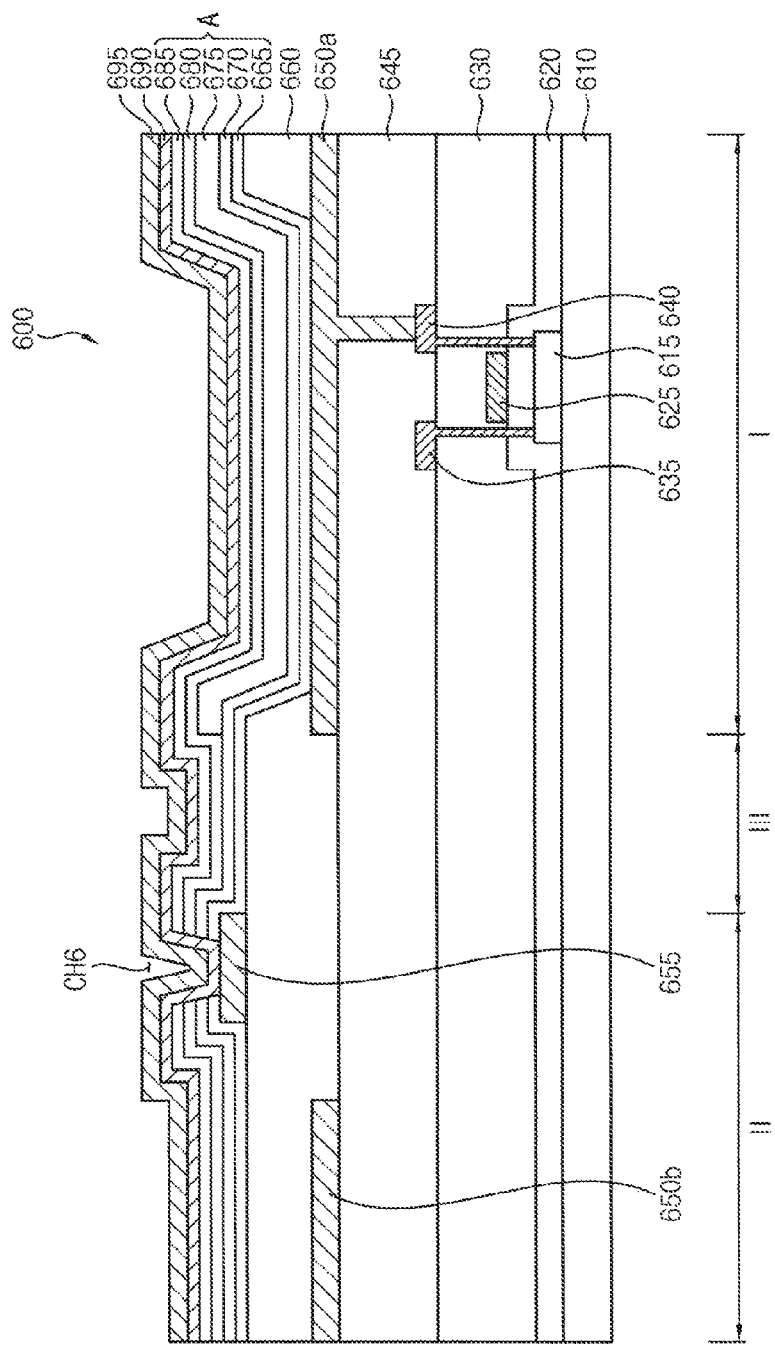
FIG. 6 is a cross-sectional view illustrating an OLED device in accordance with an exemplary embodiment.

FIG. 6 is a cross-sectional view illustrating an OLED device in accordance with some exemplary embodiments.

Detailed descriptions of elements of the OLED device 600 which are substantially the same as or similar to those illustrated with reference to FIG. 1 are omitted.

Referring to FIG. 6, the OLED device 600 may include a substrate 610, at least one semiconductor element, anodes 650a and 650b, an auxiliary electrode 655, a pixel defining layer 660, a light emitting structure A, a contact hole CH6, a lower cathode 690, and an upper cathode 695.

The auxiliary electrode 655 may be disposed on the pixel defining layer 660 of the transparent region II. Accordingly, the auxiliary electrode 655 may be on a different plane from the anodes 650a and 650b. For example, the auxiliary electrode 655 may be disposed on the pixel defining layer 660 of the transparent region II, and first and second anodes 650a and 650b may be disposed on the planarization layer 645 of the pixel and transparent regions I and II, respectively.

The pixel defining layer 660 may include a pixel opening that defines the pixel region I and be extended along the transparent region II. For example, the pixel defining layer 660 may include transparent organic or inorganic materials.

FIGS. 7 to 12 are cross-sectional views illustrating a method of manufacturing an OLED device in accordance with exemplary embodiments.

In FIGS. 7 to 12, although the method of manufacturing the OLED device is described with respect to a device that is substantially the same as or similar to the exemplary embodiment illustrated with reference to FIG. 1, those skilled in the art may readily understand that the OLED devices 200 to 600 in FIGS. 2 to 6 may be manufactured through obvious modifications, such as deposition processes and etching processes.

Figure 7:
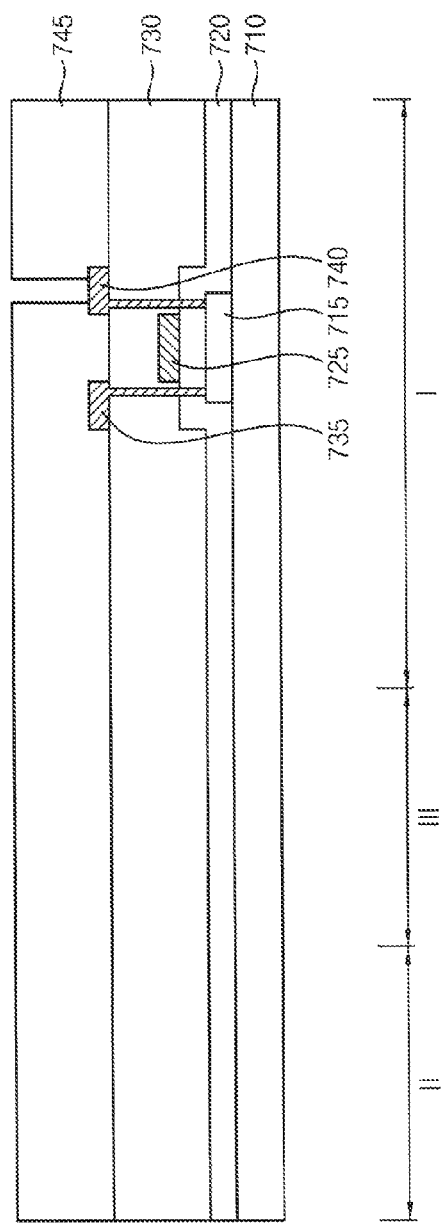
FIG. 7, FIG. 8, FIG. 9, FIG. 10, FIG. 11, and FIG. 12 are cross-sectional views illustrating a method of manufacturing an OLED device in accordance with an exemplary embodiment.

Referring to FIG. 7, a semiconductor element and a planarization layer 745 that covers the semiconductor element may be formed on a substrate 710.

An active pattern forming layer (not illustrated) may be formed on the substrate 710 using a material that contains silicon or an oxide semiconductor, and then the active pattern 715 may be formed on the substrate 710 through a predetermined patterning process.

A gate insulation layer 720 may be formed on the active pattern 715. For example, the gate insulation layer 720 may be formed using an insulating material, such as a silicon compound (i.e., silicon nitride, silicon oxide, silicon oxynitride, or the like). The gate insulation layer 720 may be formed as a single-layer or may be multi-layer considering the transmittance of the OLED device.

A gate electrode 725 may be formed on the gate insulation layer 720. The gate electrode 725 may partially overlap the active pattern 715. For example, the gate electrode 725 may include metal, alloy, metallic nitride, conductive metallic oxide, a transparent conductive material, or the like.

An insulating interlayer 730 may be formed on the gate insulation layer 720 and cover the gate electrode 725. In exemplary embodiments, the insulating interlayer 730 may be formed having thickness sufficient such that the insulating interlayer 730 may have a flat top surface. For example, the insulating interlayer 730 may include a silicon compound, such as silicon nitride, silicon oxide, silicon oxynitride, or the like.

A source electrode 735 and a drain electrode 740 may be contacted to the active pattern 715 via a contact hole that penetrates the gate insulation layer 720 and the insulating interlayer 730. For example, the source and drain electrodes 735 and 740 may include metal, alloy, metallic nitride, conductive metallic oxide, a transparent conductive material, or the like. Therefore, the semiconductor element that includes the active pattern 715, the gate insulation layer 720, the gate electrode 725, the insulating interlayer 730, the source electrode 735 and the drain electrode 740 may be provided on the substrate 710.

The planarization layer 745 may be formed on the insulating interlayer 730 and cover the semiconductor element. For example, the planarization layer 745 may include a transparent organic material, such as acrylic resins, polyimide resin, epoxy-based resins, or polyester resins.

Figure 8:
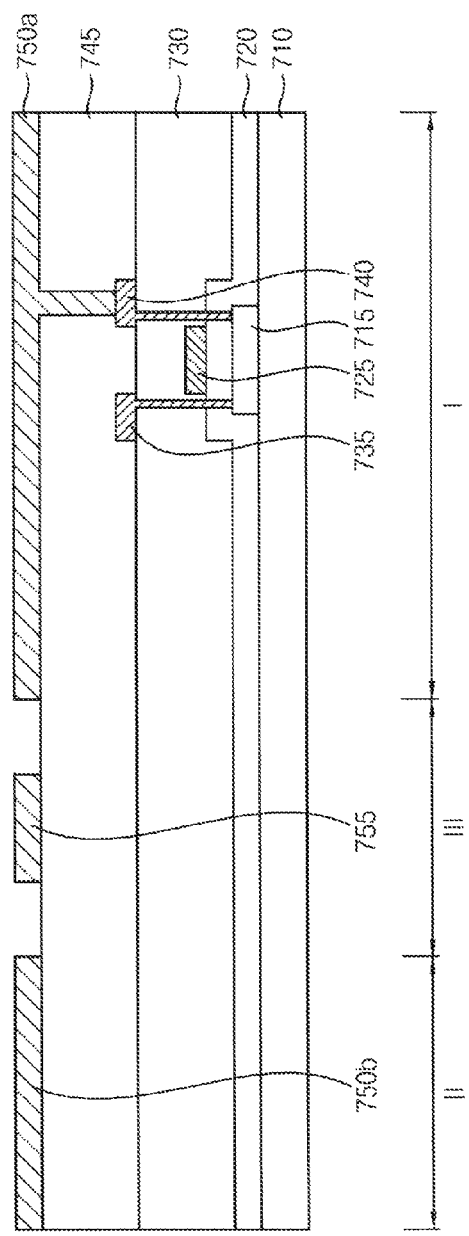

Referring to FIG. 8, anodes 750a and 750b and an auxiliary electrode 755 may be formed on the planarization layer 745. The anodes 750a and 750b and the auxiliary electrode 755 may be simultaneously formed using one mask. For example, the first anode 750a may be formed on the planarization layer 745 of the pixel region I, the second anode 750b may be formed on the planarization layer 745 of the transparent region II, and the auxiliary electrode 755 may be formed on the planarization layer 745 of the boundary region III. In some exemplary embodiments, the first and second anodes 750a and 750b, and the auxiliary electrode 755 may include $TiO_x$, ITO, IZO, $ZnO_x$, $MgO_x$, PEDOT:PSS, graphene, CNT, or the like. Therefore, the auxiliary electrode 755 may be formed without an additional process, so that manufacturing costs may be reduced and manufacturing processes may be simplified.

Figure 9:
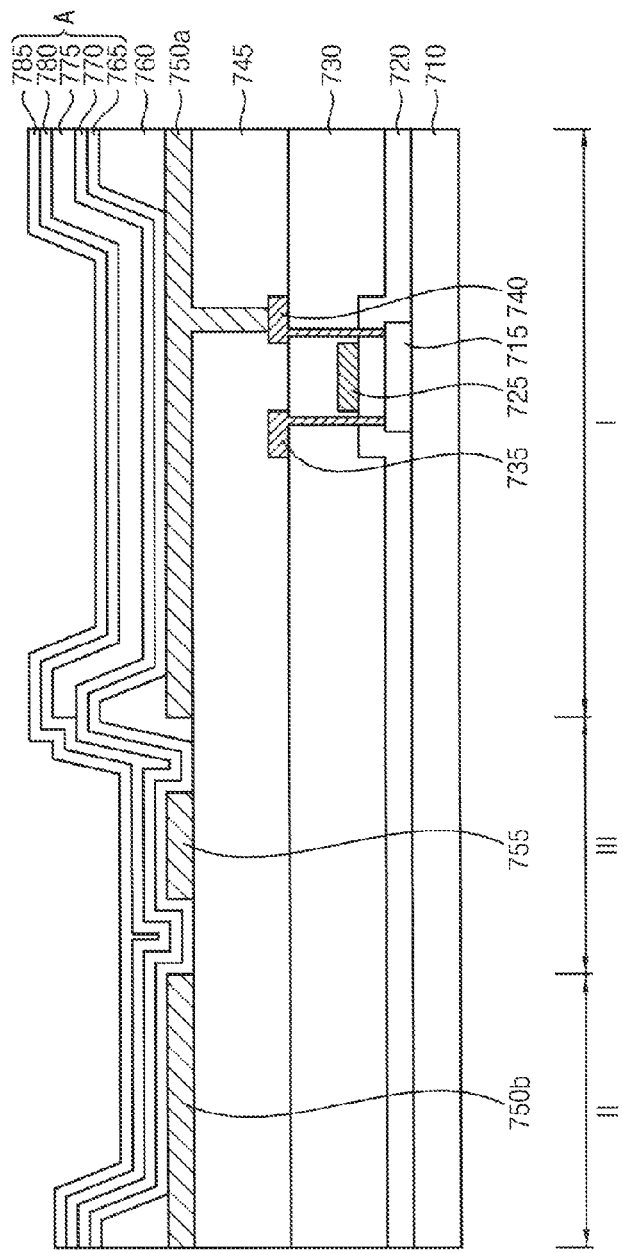

Referring to FIG. 9, a pixel defining layer 760 and a light emitting structure A may be formed on the planarization layer 745 and cover the first and second anodes 750a and 750b, and the auxiliary electrode 755. For example, after formation of the pixel defining layer 760, a hole injection layer 765, a hole transport layer 770, an organic light emitting layer 775, an electron transport layer 780, and an electron injection layer 785 may be sequentially formed to acquire the light emitting structure A.

Figure 10:
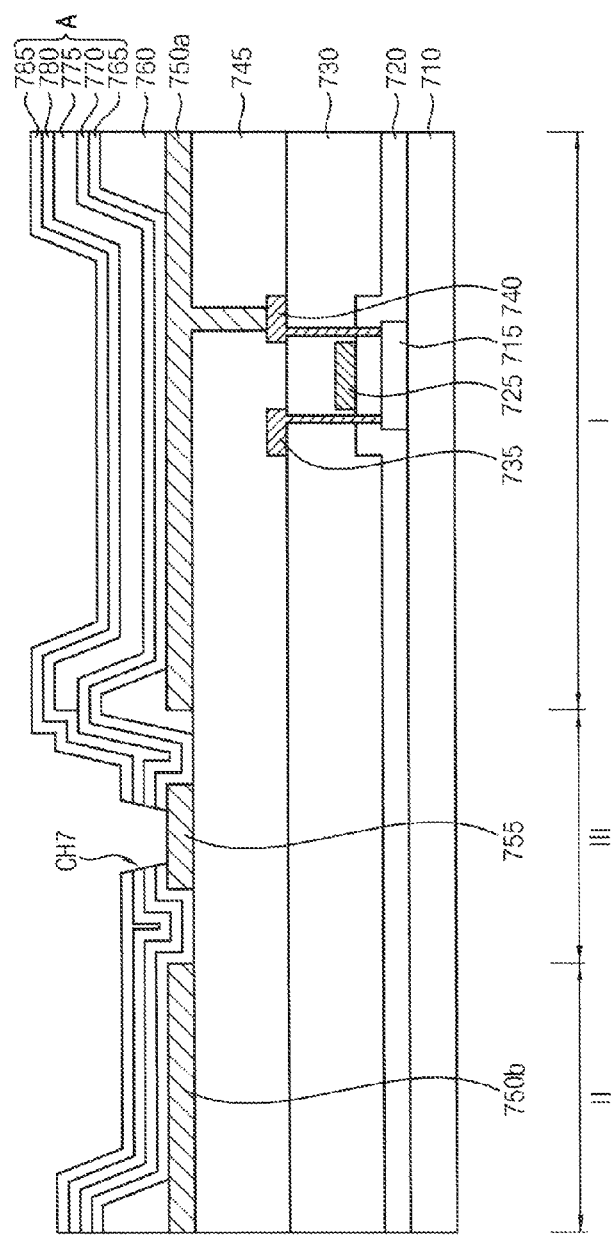

Referring to FIG. 10, the light emitting structure A may be partially removed by a laser drilling process to selectively form a contact hole CH7. The laser drilling process is used to form the contact hole CH7 such that the contact hole CH7 may be selectively formed on a desired area. To remove generated particles during the contact hole CH7 forming process, the laser drilling process may be performed under an inert gas atmosphere such as nitrogen ($N_2$) or argon (Ar). However, as the light emitting structure A is exposed to the inert gas, an interface of the light emitting structure A may become unstable. Therefore, in some exemplary embodiments, considering possible damage to the light emitting structure A, the laser drilling process may be performed under a vacuum atmosphere. When the contact hole CH7 is formed under the vacuum atmosphere, the damage on the light emitting structure A may be minimized so that a possible leakage current caused by the damage on the light emitting structure A may be fully prevented.

Figure 11:
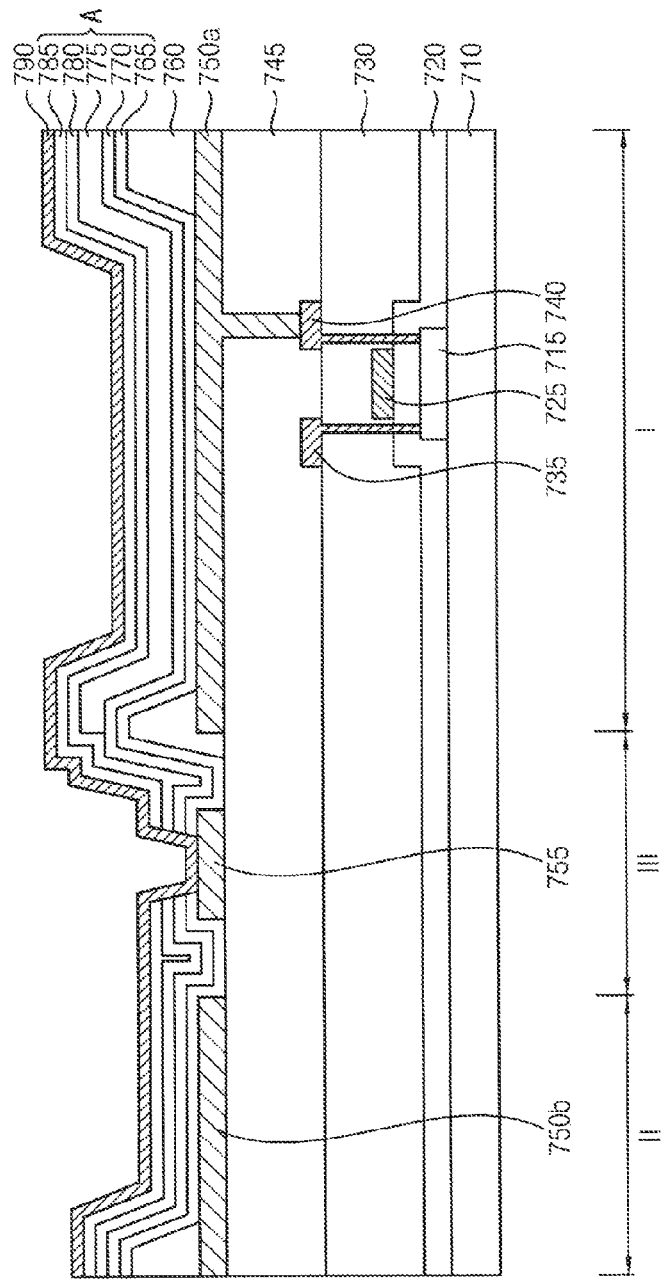

Referring to FIG. 11, a lower cathode 790 may be formed on the electron injection layer 785. Although the lower cathode 790 may be formed to have a relatively small thickness, the lower cathode 790 may be formed along a bottom and side walls of the contact hole CH7 and electrically connected to the auxiliary electrode 755 at the bottom of the contact hole CH7. Accordingly, a voltage drop at the lower cathode 790, which may be increased by the thin thickness of the lower cathode 790, may be reduced. For example, the lower cathode 790 may include Au, Al, Ag, magnesium-silver alloy, silver-magnesium alloy, or the like.

Figure 12:
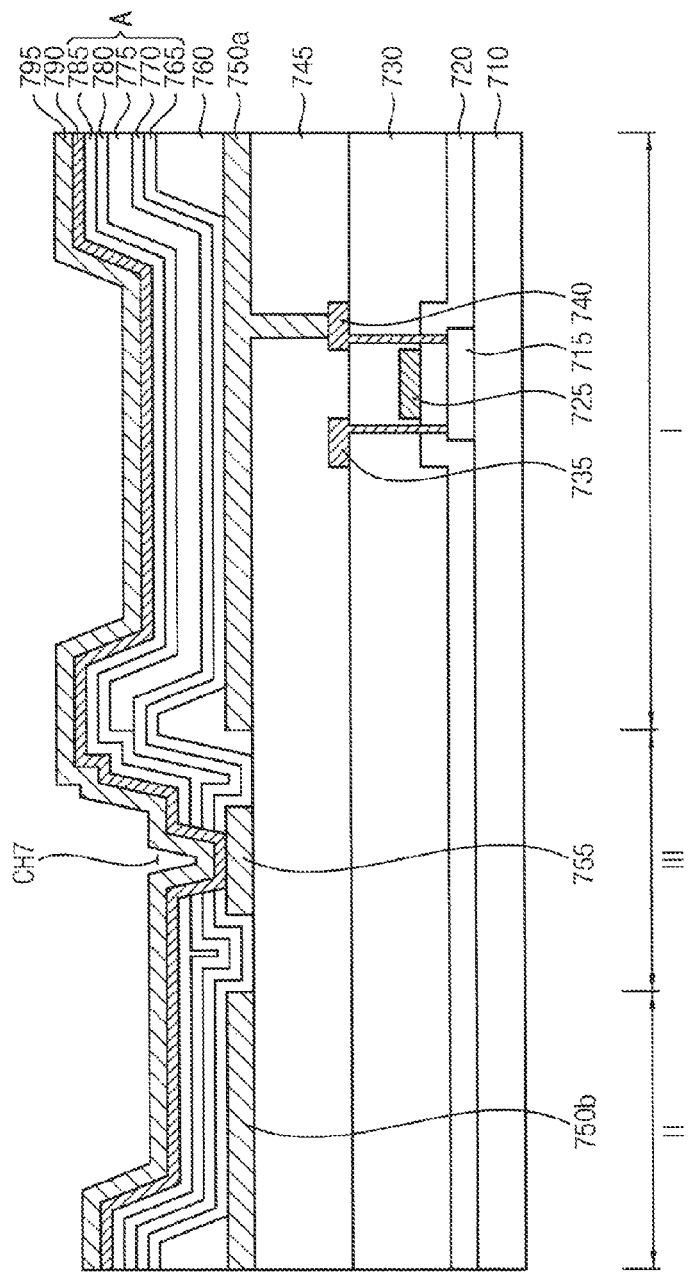

Referring to FIG. 12, an upper cathode 795 may be formed on the lower cathode 790. The upper cathode 795 may be formed by a sputtering process, a deposition process using plasma, or the like. Damage of the light emitting structure A when the upper cathode 795 is formed may be prevented by the lower cathode 790. The upper cathode 195 may include $TiO_x$, ITO, IZO, $ZnO_x$, $MgO_x$, PEDOT:PSS, graphene, CNT, or the like. The thickness of the upper cathode 795 may be limited under a certain value to maintain the transmittance of the upper cathode 795. However, the upper cathode 795 may be formed with a relatively large thickness within a certain range in which the transmittance of the upper cathode 795 may not be decreased, so that the resistance of the upper cathode 795 may not be increased.

In an OLED device according to exemplary embodiments, the auxiliary electrode may be electrically connected to the lower cathode via the contact hole between the pixel region and the transparent region to reduce a resistance of the lower cathode. Moreover, the upper cathode including a transparent material may be formed on the lower cathode to improve transmittance of the transparent region.

In the method of manufacturing the OLED device according to exemplary embodiments, the light emitting structure may be selectively etched by the laser drilling process to form the contact hole, so that process yield and process efficiency may be improved, and a voltage drop at the lower cathode may be decreased. Furthermore, damage at the lower cathode may be prevented in the upper cathode forming process. Therefore, the OLED device having high quality and high reliability may be provided.

Although a few exemplary embodiments of the OLED devices and the methods of manufacturing the OLED devices have been described with reference to the figures, those skilled in the art will readily appreciate that many modifications are possible in the exemplary embodiments without materially departing from the novel teachings and advantages of the present inventive concept.

The present inventive concept may be applied to any electronic device including a transparent organic light emitting display device. For example, the present inventive concept may be applied to display devices for a vehicle, a ship or a plane, mobile communication devices, display devices for a display or information offering, medical display devices, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display (OLED) device, comprising:
    an anode disposed on a substrate;
    a pixel defining layer disposed on the anode, the pixel defining layer comprising a first opening that exposes a portion of the anode;
    an auxiliary electrode disposed on the substrate outside the first opening;
    a light emitting structure disposed on the anode, the light emitting structure comprising a plurality of layers, at least one of the plurality of layers extending out of the first opening to cover the auxiliary electrode;
    a lower cathode disposed on the light emitting structure; and
    an upper cathode disposed on the lower cathode,
    wherein the lower cathode is electrically connected to the auxiliary electrode via a contact hole which penetrates the light emitting structure.

2. The OLED device of claim 1, wherein a thickness of the lower cathode is less than the thickness of the upper cathode.

3. The OLED device of claim 1, wherein a light transmittance of the upper cathode is greater than a light transmittance of the lower cathode.

4. The OLED device of claim 1, wherein the upper cathode comprises at least one material selected from the group consisting of titanium oxide (TiOx), indium tin oxide (ITO), indium zinc oxide (IZO), zinc oxide (ZnOx), magnesium oxide (MgOx), poly(3,4-ethylenedioxyehiophene) polystyrene sulfonate (PEDOT:PSS), graphene, and carbon nanotube (CNT).

5. The OLED device of claim 1, wherein the lower cathode comprises at least one material selected from the group consisting of gold (Au), aluminum (Al), silver (Ag), magnesium-silver alloy (MgAg), and silver-magnesium alloy (AgMg).

6. The OLED device of claim 1, wherein the anode and the auxiliary electrode are disposed on substantially the same plane.

7. The OLED device of claim 6, wherein the anode and the auxiliary electrode comprise substantially the same material.

8. The OLED device of claim 1, wherein the anode and the auxiliary electrode are disposed on different planes.

9. The OLED device of claim 8, wherein the anode and the auxiliary electrode comprise different materials.

10. The OLED device of claim 1, wherein the pixel defining layer further comprising a second opening that exposes the auxiliary electrode, the second opening transmitting a light.

11. The OLED device of claim 10, wherein a light transmittance of the auxiliary electrode is greater than a light transmittance of the anode.

12. A method of manufacturing an organic light emitting display (OLED) device, comprising:

forming an anode on a substrate;

forming a pixel defining layer on the anode, the pixel defining layer comprising a first opening that exposes a portion of the anode;

forming an auxiliary electrode on the substrate outside the first opening;

forming a light emitting structure on the anode, the light emitting structure comprising a plurality of layers, at least one of the plurality of layers extending out of the first opening to cover the auxiliary electrode;

forming a contact hole which penetrates the light emitting structure to expose the auxiliary electrode;

forming a lower cathode on the light emitting structure, the lower cathode being electrically connected to the auxiliary electrode via the contact hole; and forming an upper cathode on the lower cathode.

13. The method of claim 12, wherein the contact hole is formed by a laser drilling process.

14. The method of claim 13, wherein the laser drilling process is performed under an inert gas atmosphere.

15. The method of claim 13, wherein the laser drilling process is performed under a vacuum atmosphere.

* * * * *